United States Patent [19]
Codama et al.

[11] Patent Number: 5,352,921
[45] Date of Patent: Oct. 4, 1994

[54] PHOTOELECTRIC CONVERSION DEVICE AND IMAGE SENSOR

[75] Inventors: Mitsufumi Codama; Ichiro Takayama, both of Kanagawa, Japan

[73] Assignee: Semiconductor Energy Laboratory Co., Ltd., Kanagawa, Japan

[21] Appl. No.: 120,322

[22] Filed: Sep. 14, 1993

Related U.S. Application Data

[63] Continuation of Ser. No. 853,394, Mar. 17, 1992, abandoned.

[30] Foreign Application Priority Data

Mar. 18, 1991 [JP] Japan .................. 3-080801

[51] Int. Cl.⁵ .................. H01L 27/14; H01L 31/00
[52] U.S. Cl. .................. 257/448; 257/222; 257/443
[58] Field of Search ............. 357/2, 30 D, 30 J, 30 K, 357/30 Q, 30 R; 257/53, 434, 431, 443, 448, 222

[56] References Cited

U.S. PATENT DOCUMENTS

| | | |
|---|---|---|
| 4,403,239 | 9/1983 | Yamazaki ............... 357/30 D |
| 4,811,069 | 3/1989 | Kakinuma et al. ............ 257/443 |
| 4,831,429 | 5/1989 | Nakashima et al. ............ 357/30 D |
| 4,855,802 | 8/1989 | Kato ..................... 257/443 |
| 4,943,839 | 7/1990 | Kumano et al. ............. 257/222 |
| 4,997,773 | 3/1991 | Nobue et al. ............ 357/30 K |
| 5,017,987 | 5/1991 | Nanjoh et al. .............. 257/432 |
| 5,043,784 | 8/1991 | Yamamoto et al. .......... 357/30 K |
| 5,140,398 | 8/1992 | Matsuda et al. ............. 357/30 D |

FOREIGN PATENT DOCUMENTS

| | | | |
|---|---|---|---|
| 61-216360 | 9/1986 | Japan | ............... 357/30 K |
| 61-281550 | 12/1986 | Japan | ............... 357/30 Q |
| 63-316472 | 12/1988 | Japan | ............... 257/448 |
| 1-21956 | 1/1989 | Japan | ............... 257/448 |
| 1-80080 | 3/1989 | Japan | ............... 257/448 |
| 1-273351 | 11/1989 | Japan | ............... 257/448 |
| 2-132860 | 5/1990 | Japan | ............... 257/448 |
| 2-284474 | 11/1990 | Japan | ............... 257/448 |
| 2-295167 | 12/1990 | Japan | ............... 357/30 K |
| 3-212975 | 9/1991 | Japan | ............... 257/448 |

*Primary Examiner*—Rolf Hille
*Assistant Examiner*—Minhloan Tran
*Attorney, Agent, or Firm*—Sixbey, Friedman, Leedom & Ferguson

[57] ABSTRACT

Image sensors using thin films and having a higher production yield, low production cost and higher reading resolution are provided. In a photoelectric conversion device having a thin film semiconductor layer is provided that performs photoelectric conversion with a first electrode structured mainly by a metallic material on a light transmitting insulating substrate or an insulating film and a second electrode on the thin film semiconductor layer. A thin insulating film is formed at least partially between the second electrode and the thin film semiconductor layer or the thin film semiconductor layer and the first electrode.

13 Claims, 9 Drawing Sheets

PHOTOELECTRIC CONVERSION DEVICE AND IMAGE SENSOR

This application is a continuation of Ser. No. 07/853,394, filed Mar. 17, 1992, now abandoned.

BACKGROUND OF THE INVENTION

The present invention relates to a photoelectric conversion device and an image sensor applicable to facsimile, image scanner and digital copier, and to a method for forming the same.

Lately along the spread of facsimiles, a down-sized, light-weight and low price image sensor is being demanded. Image sensors used for facsimile, image scanner and digital copier, etc. are roughly divided into three types of non-contact type, contact type and full-contact type image sensors.

Currently, because the non-contact type image sensor using CCD projects an image of an original to the CCD through a reducing lens system, it is disadvantageous as compare to the other two systems in term of down-sizing and lightening, though it is advantageous in terms of price since it can be produced by a currently established LSI process using silicon wafers and since the CCD chip may be smaller.

On the other hand, although the contact and full-contact type image sensors are advantageous compare to the non-contact type in terms of down-sizing and lightening, their production cost is high due to difficulties in the fabrication process, packaging and assembly and the use of expensive parts such as a selfoc lens array and a thin plate glass has been being another large factor that hampers lowering of the price of those two type image sensors.

In concrete, mainly two types of contact type image sensors, i.e. a multi-chip type in which many MOSLSIs are packaged and a thin film type in which amorphous silicon thin films are used for its photo sensor part and are formed on an insulating substrate, are adopted and put into practical use for facsimiles.

A selfoc lens array, optical lenses that lead reflected light from an original to surface of a light receiving sensor, is used for them. The multi-chip type image sensor is created by LSI technology which is Today's most advanced technology, so that its yield is considerably high and it can be stably supplied. On the other hand, the production cost of the thin film type image sensor is high because a yield of its thin film semiconductor layer part is bad.

Although the full-contact type image sensor using thin film elements is the most advantageous especially in terms of down-sizing and lightening because it does not use the reduction lens system or the selfoc lens array, the bad yield of the thin film semiconductor layer part has been one of the large factors that hamper the lowering of the cost and it has been demanded to be able to provide the thin film semiconductor part stably with better yields. Moreover, as described before, the contact type image sensor also has the same problem when its photoelectric converting element part is composed of thin film elements.

As photoelectric converting elements of the image sensor, photoconductor type and photodiode type elements are known and being put into practical use. Generally the photoconductor type element has a characteristic that it is strong against noise since it can flow a large current, but its photo-responsibility is bad and it is disadvantageous to the demand for speeding up operations of facsimile. On the other hand, responsibility to light of the photo-diode type element is fast, though a current that flows in it smaller, and it is considered to become the main stream in the future.

FIGS. 2A and 2B show an upper plan view and a schematic section view of only a photoelectric converting element part of a prior art photo-diode type image sensor. In the figures, an insulating film (silicon oxide film) 21 that blocks alkali metal ions such as sodium is coated on a substrate 20. Provided on the insulating film 21 is a first electrode 22 on which an opening 26 for inputting light is created. Formed on the first electrode 22 is an amorphous silicon thin film semiconductor 23 which makes up a PIN type diode. Provided further on a photoelectric converting element area 27 of the thin film semiconductor 23 is an light transmitting electrode 24 and a metal electrode 25 is formed by being connected to the light transmitting electrode 24.

Normally conductivity of the thin film semiconductor becomes high when it is irradiated by light, so that a large part of light is blocked by the first electrode 22. To that end, the first electrode 22 is provided also at the part other than the photoelectric converting element part.

Because a thickness of this thin film semiconductor is less than 1 micrometer and it is fabricated by depositing films by means of vapor deposition and others, it has a high possibility that it does not function as a photoelectric converting element by causing a short or leak at a part 28 for example between the first and second electrodes 22, 25 due to contamination of dust and impurities.

Furthermore, when the photoelectric converting elements as shown in FIG. 2 are arranged one-dimensionally as shown in FIG. 3A to create an image sensor, a metal of the second electrode is left around an end portion 37 of the thin film semiconductor that exists between one photoelectric converting element 38 and an adjoining photoelectric converting element 39 and causes a short between those photoelectric converting elements.

That is, when such image sensor is created, acid treatment is sometimes carried out in a process after forming the semiconductor layer for example as a pre-treatment for connecting the metal electrode to an impurity area of TFT on the same substrate. Hydrofluoric acid is used as an acid for this treatment, so that the silicon oxide film 31 is etched around the end portion 37 of the thin film semiconductor layer and a concave portion is formed. Then a metallic layer is formed on the whole surface and is patterned to create the metal electrode 35, and the metal 36 is left at the concave portion, causing a short or leak between the photoelectric converting elements 38 and 39.

Many electric shorts or leaks are caused inside or between photoelectric converting elements, thereby reducing the production yields of photoelectric conversion devices and image sensors.

Furthermore, such failures as reduction or coloring of the transparent conducting films 24 and 34 are caused in the manufacturing process due to a fluid for releasing resist or a fluid for etching the metallic thin film wirings, decreasing the production yields further.

SUMMARY OF THE INVENTION

Accordingly, it is an object of the present invention to achieve a high production yield and to realize a low production cost of contact and full-contact type image sensors using thin films and to achieve a high reading resolution, by solving the aforementioned problems.

In order to attain the foregoing and other objects, a photoelectric conversion device in accordance with the present invention comprises:

an insulator;

a first electrode comprising a metal and provided on said insulator;

a photoelectric conversion layer provided on said first electrode;

a second electrode comprising a metal layer and a transparent conductive layer provided on said photoelectric conversion layer with at least a portion of said transparent conductive layer being in contact with said photoelectric conversion layer; and an insulating film provided between said photoelectric conversion layer and at least one of said first electrode and said metal layer.

That is, a photoelectric conversion device having a thin film semiconductor layer that performs photoelectric conversion with a first electrode structured mainly by a metallic material on a light transmitting insulating substrate or insulating film and a second electrode on said thin film semiconductor layer, is provided with an insulating film formed at least at part between the second electrode and the thin film semiconductor layer that structure the photoelectric converting part or between the thin film semiconductor layer and the first electrode. When a plurality of the photoelectric conversion devices are arranged in one or two-dimensionally to structure an image sensor, the insulating film is also extended and provided to the area between them, i.e. between the sensor bits, not only the photoelectric converting area. In this case, an insulating film is provided on at least one of upper and lower surfaces of a semiconductor layer (e.g. comprising p-type, intrinsic and n-type semiconductor layers in a pin junction structure) provided on the insulating substrate or the insulating film between the sensor bits.

FIG. 1A, 1B and 1C are schematic drawings illustrating such state. FIG. 1A is a plan view of the image sensor in which the photoelectric conversion devices of the present invention are arranged in line, FIG. 1B is a schematic section view of the photoelectric conversion device and FIG. 1C is a schematic section view illustrating the area between the sensor bits.

In FIG. 1, the insulating thin film 5 is formed between a metal electrode 7 constituting the second electrode and the thin film semiconductor (photoelectric conversion layer) 4. This insulating film exists on the thin film semiconductor 4 also between the sensor bits, i.e., between the photoelectric converting element areas as shown in FIG. 1C.

As seen in the figure, the insulating film 5 is formed coating also a transparent electrode 6 which is a light inputting surface of the photoelectric conversion device.

The insulating thin film is thus formed between the semiconductor thin film and at least one of the first electrode and the second electrode, so that a leak current or short between the thin film electrodes due to pinholes produced in the semiconductor thin film may be reduced considerably to a degree almost no such failure is caused.

Furthermore, the end portion of the pattern of the semiconductor thin film which exists between the sensor bits is coated by the aforementioned insulating film, so that no electrode material is left at the step of the pattern and a leak current between the sensor bits is significantly reduced. The leak current between the first and second electrodes is also reduced. Since the leak current that flows between adjoining second electrodes through the intermediary of the semiconductor layer is reduced, a reading resolution of the image sensor may be improved.

In addition to that, the insulating thin film 5 is provided at a portion 10 (around the end portion of the thin film semiconductor 4) in FIG. 1B, so that a leak current between the metal electrode 7 and the first electrode 3 at this portion may be prevented from generating.

Furthermore, when the insulating thin film is formed so that it covers the transparent conducting film on the light irradiating surface of the photoelectric converting area, not only between the semiconductor layer and the electrodes, the transparent conducting film is coated and protected by the insulating film and such failures as reduction, coloring and corrosion of the transparent conducting film are not caused at all by the resist releasing fluid and the fluid for etching electrode materials used in the later processes.

BRIEF DESCRIPTION OF THE DRAWINGS

In the drawings, forming a part hereof, in which like reference characters denote like parts in the various views.

DETAILED DESCRIPTION OF THE PREFERRED EMBODIMENTS

Figure 1A:
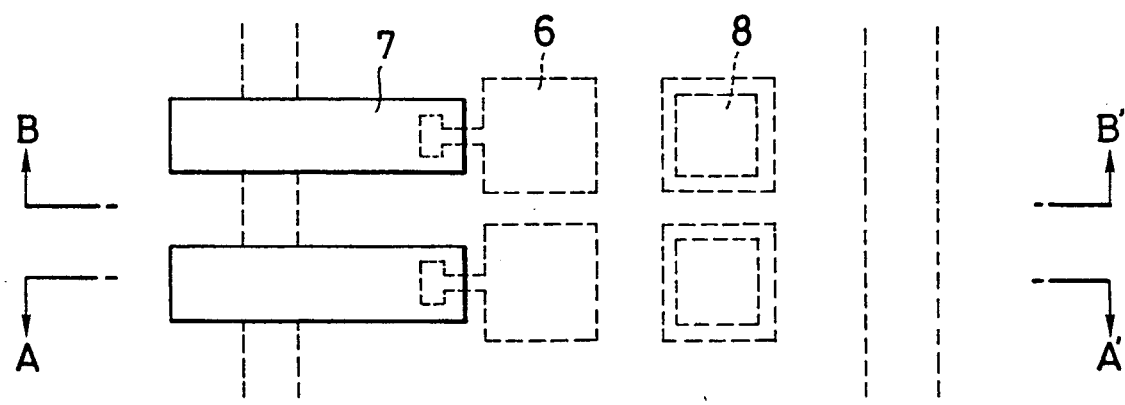
FIGS. 1A, 1B and 1C are a plan view and schematic section views of a structure according to the present invention.
Figure 1B:
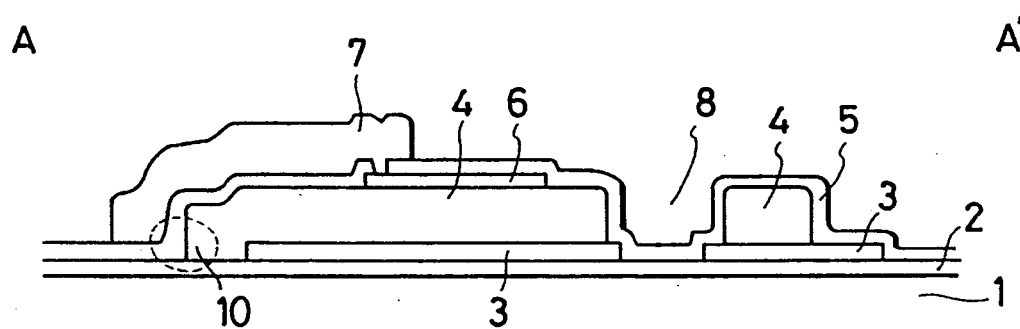
Figure 1C:
Figure 2A:
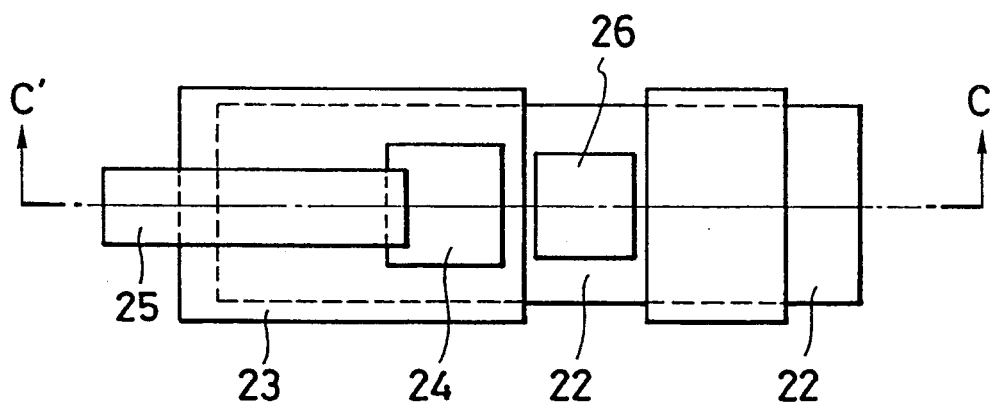
FIGS. 2A and 2B are schematic drawings illustrating a prior art device.
Figure 2B:
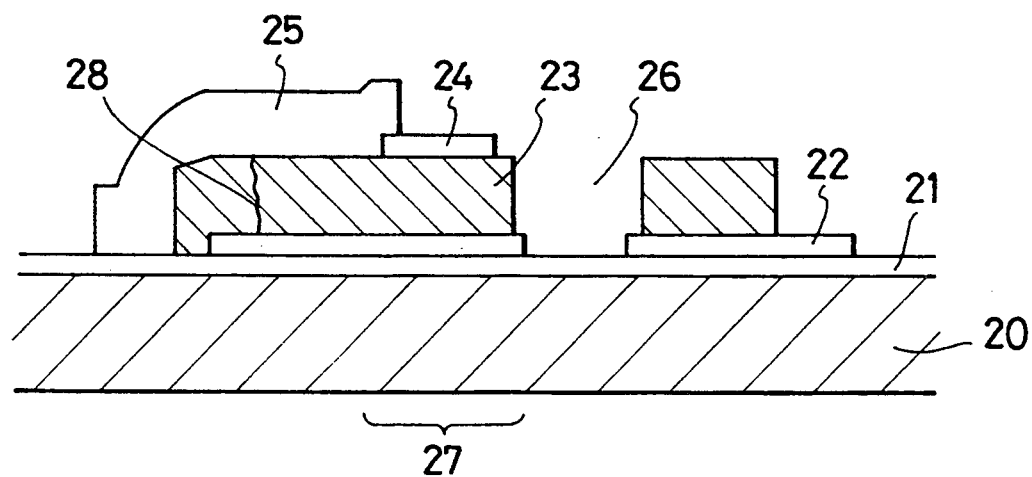
Figure 3A:
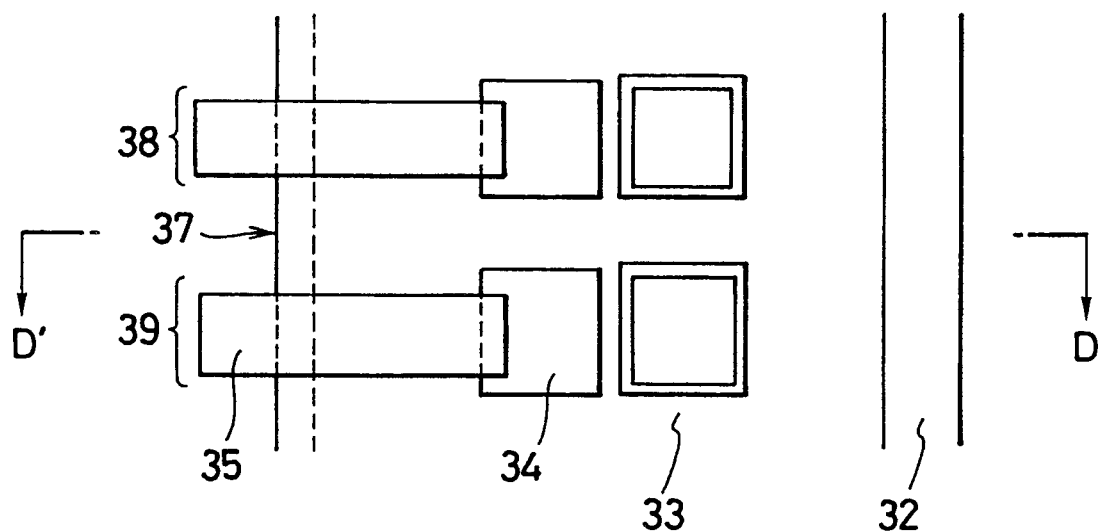
FIGS. 3A and 3B are schematic drawings illustrating the prior art device.
Figure 3B:
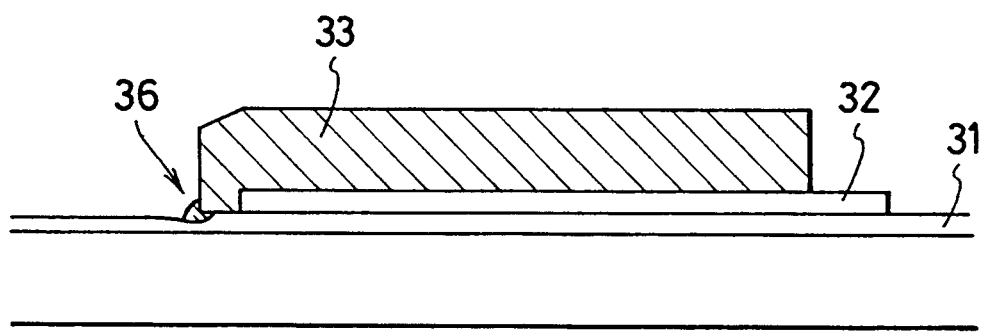

Referring now to the drawings, preferred embodiments of the present invention will be explained.

First Embodiment

A photoelectric converting element part of a full-contact type image sensor is fabricated on a glass or quartz light transmitting insulating substrate 1 in this embodiment.

Figure 4A:
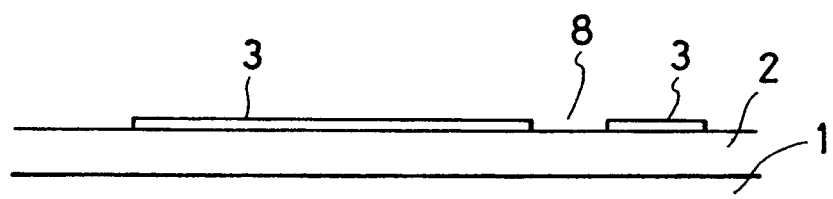
FIGS. 4A through 4G are schematic section views illustrating production processes of an image sensor having the structure of the present invention.
Figure 4B:
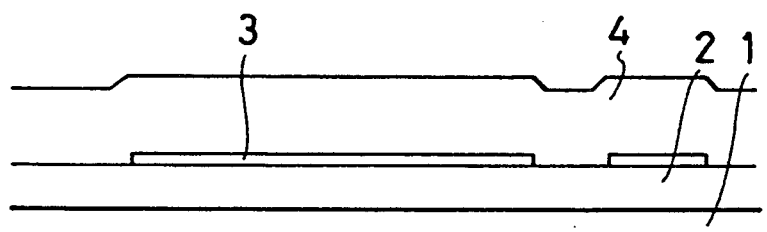
Figure 4C:
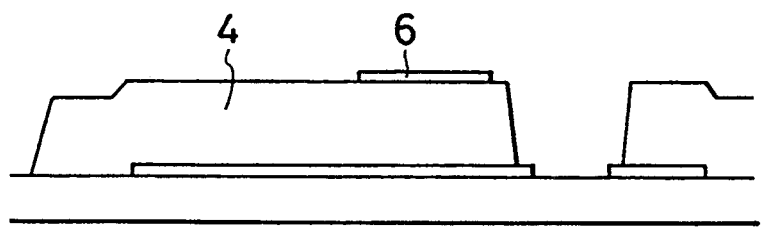
Figure 4D:
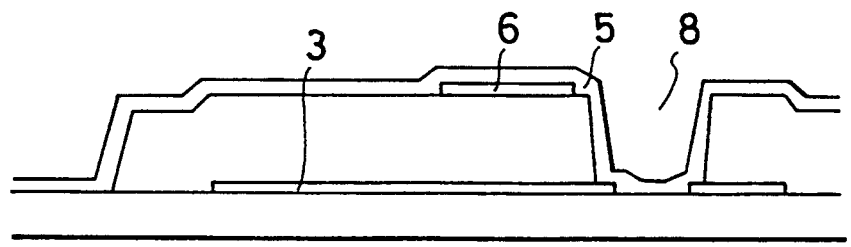
Figure 4E:
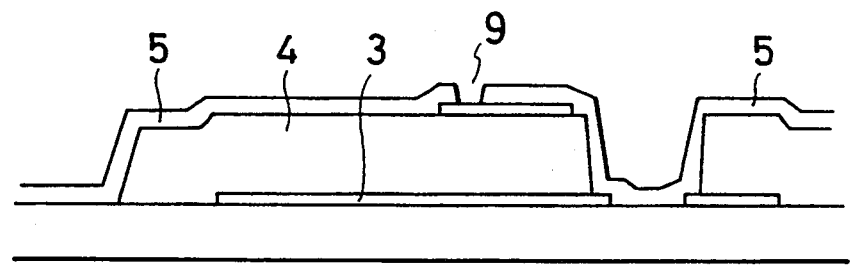
Figure 4F:
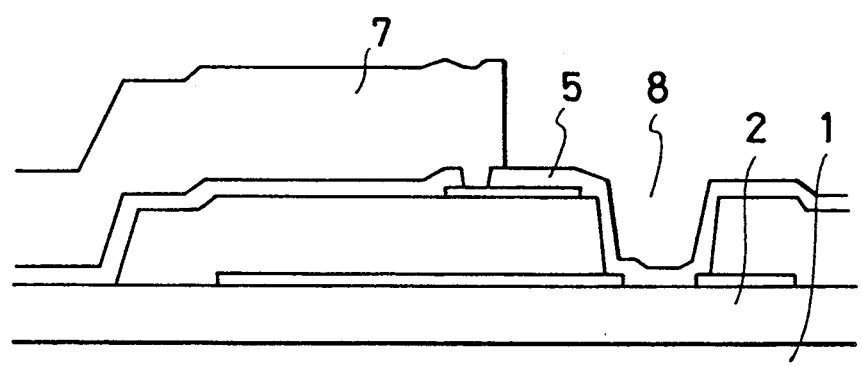
Figure 4G:
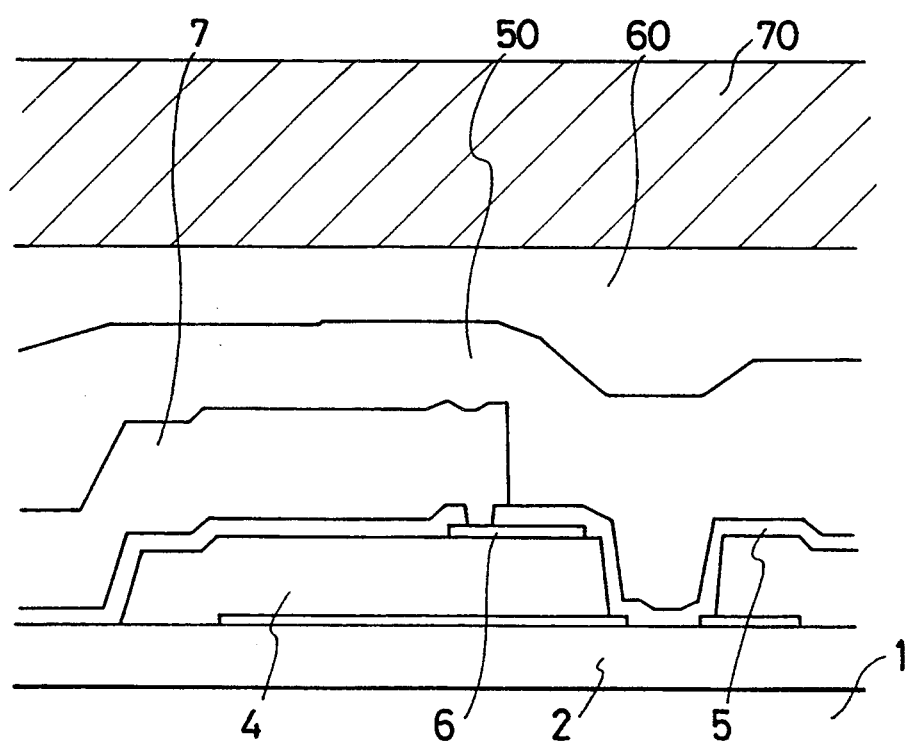
Figure 5:
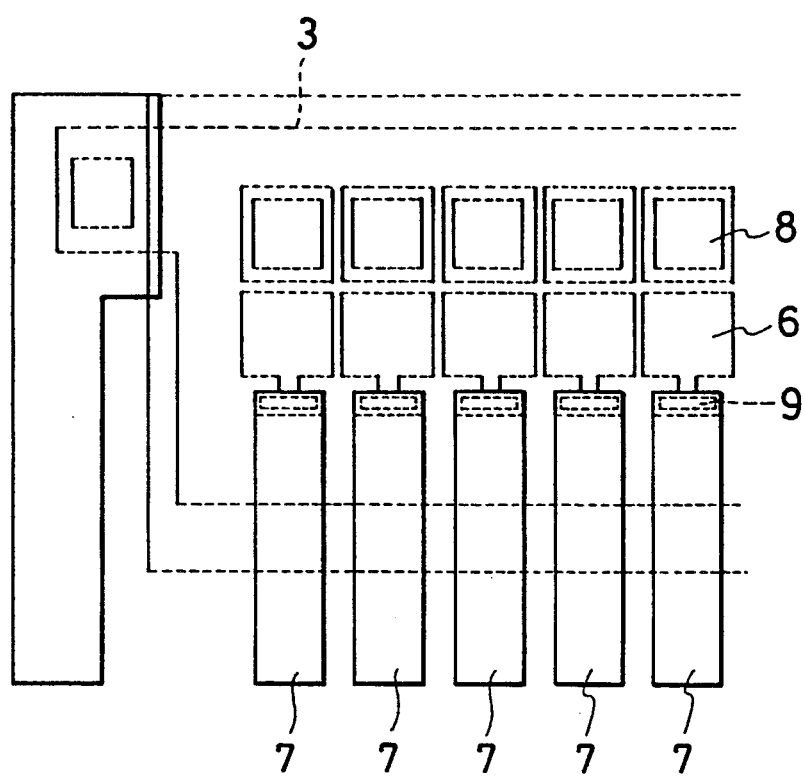
FIG. 5 is a schematic plan view of a structure according to the present invention.

FIG. 4 schematically shows its process and FIG. 5 shows a schematic plan view of the full contact type image sensor of the present embodiment after having been created.

A silicon oxide film 2 for preventing alkali impurities from diffusing from a substrate 1 is formed with a thickness of 2000 angstrom on the glass substrate 1 using organic silica solution. A metal 3, for example chrome, whose etching speed is fully late to an etchant used for silicon or silicon oxide is formed on the silicon oxide film 2 into a film with a thickness of 1000 to 2000 Å by sputtering and is patterned into a first electrode 3 which also serves as a light blocking layer by photolithographic process as shown in FIG. 4A. A light introducing window (opening) 8 is provided per each one bit sensor in the first electrode whose other part functions as the light blocking layer.

Then a semiconductor layer 4 is formed as shown in FIG. 4B. The semiconductor layer 4 comprises an N-type amorphous silicon carbide layer in which phosphorus is doped, an intrinsic amorphous silicon layer in which no impurity is doped and a P-type amorphous silicon carbide layer in which boron is doped formed into a film by well known plasma CVD. The thickness of the film may be determined so that electrical characteristics required such as, for example, capacity between the first and second electrodes and characteristics of diode of the photodiode are optimized; the P-type and N-type layers are preferred to be 100 to 600 Å, respectively, and the intrinsic layer is preferred to be 3000 Å to 1.2 micrometer.

Then an ITO 6, a transparent conducting film, is formed with a thickness of 700 to 2000 Å and is patterned into a predetermined dimension pattern of the photoelectric converting element and the semiconductor layer formed previously is dry-etched to obtain the state as shown in FIG. 4C. At this time, an opening 8 is formed in the semiconductor layer as shown in FIG. 4(C).

Then an insulating thin film, a liquid silica used as SOG (spin on glass) for example, is applied on their surface by a spin-on method and others. They are then annealed in a temperature which does not affect the characteristics of the semiconductor layer 4 much, e.g. around 200° to 300° C., to remove the solvent and to form the insulating film 5. The thickness of the film 5 may be determined by considering the capacity between a metal electrode 7 constituting the second electrode and the first electrode 3. The thickness of the film may be changed arbitrary from around 300 Å to 1.6 micrometer by conditioning the dilution ratio of the liquid silica and the rotational frequency and time of the spin-coating. This insulating film may be formed not only by applying the liquid silica, but also by forming such insulating materials as $SiO_2$, $Si_3N_4$ and SiON by such methods as sputtering, plasma CVD, optical CVD and normal pressure CVD; the similar effect may be obtained by them. However, when this insulating film is left also on the window (opening) 8 for reading the original, such a material that absorbs the light for reading or that impedes transmission of the light should not be used. To that end, the material of the insulating film should be appropriately changed depending on types of the reading light.

FIG. 4E shows a process for etching the insulating film 5 formed as described above by photolithography to create therein a contact hole (an opening) 9 for contacting the ITO 6 and the metal electrode 7.

Next, as shown in FIG. 4F, the metal electrode 7 is formed by Al for example by sputtering and is patterned by photolithography. The process for forming the thin films of the sensor part of the contact type image sensor of the present embodiment is now completed. In FIG. 4(F), an opening 8 is formed adjacent to the ITO 6. When the end portion of the semiconductor layer 4 was observed by enlarging it using such a means as a microscope or SEM after patterning aluminum, no aluminum existed there after the patterning and full insulation was being assured between the bit sensors. Moreover, since the insulating film 5 is provided covering the end portion (side portion) 10 of the thin film semiconductor 4, a leak at this portion between the first electrode 3 and the second electrode 7 may be suppressed.

Then by pasting a thin plate glass 70 having a thickness of 50 to 100 micrometer to it by an adhesive 80, the image sensor is completed. As shown in FIG. 4G, a protection film 50 may be formed by polyimide and others before pasting the thin plate glass 70.

As seen from FIGS. 4 and 5, the present invention allows to prevent a short or leak from being caused between the electrodes sandwiching the thin film semiconductor and to realize the better image sensor having no short or leak among the second electrodes between the sensor bits, so that a better image sensor having no inferior bit may be created with higher yields.

In addition to that, since the insulating film is provided covering the transparent electrode on the photoelectric converting area, no such failures as reduction, corrosion and discoloring are caused on the transparent electrode. Thereby the yields of the image sensor may be increased and it is very advantageous for lowering its cost.

Second Embodiment

In this embodiment, a photoelectric converting element of the full contact type image sensor and thin film transistors for driving of the full contact type image sensor are formed on the same substrate.

Figure 6A:
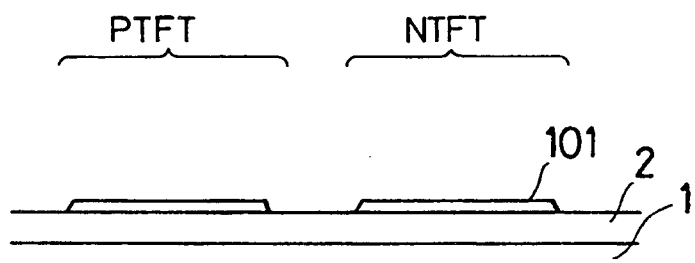
FIGS. 6A through 6K are schematic section views illustrating production processes of an image sensor having the structure of the present invention.

FIG. 6A through 6K are longitudinal section views of an image sensor obtained by a process for fabricating complementary thin film transistors and successively by a process for fabricating a photoelectric converting element part. FIG. 6A shows a state in which a silicon semiconductor film 101 is formed with a thickness of 300 to 3000 Å on an insulating substrate 1 by publicly known low pressure CVD. It is then annealed and the crystallized film is patterned into an island shape using photolithography. The film is fabricated by low pressure CVD under normal conditions in 500° C. of substrate temperature using disilane as a reaction gas.

Then a silicon oxide film 102 is formed as a gate insulating film with a thickness of 500 to 2000 Å by sputtering. A gate insulating film having excellent interfacial characteristics may be realized when the gate insulating film is formed using 100% oxygen or a mixed gas of argon and oxygen (oxygen concentration: more than 80%) as a reaction gas for sputtering at this time.

Figure 6B:
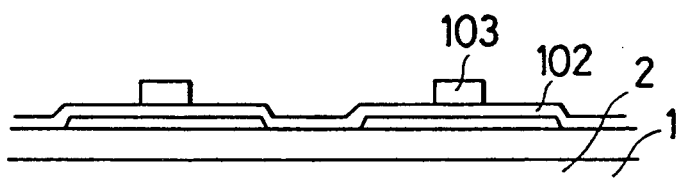

Then an amorphous silicon film 103 in which high concentrated phosphorous is doped is formed with a thickness of 1000 to 3000 Å and is patterned as shown in FIG. 6B to create a gate electrode 103.

Figure 6C:
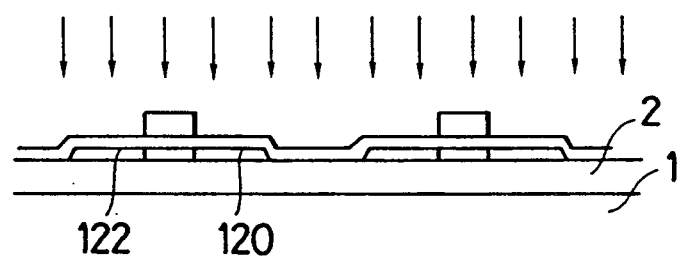
Figure 6D:
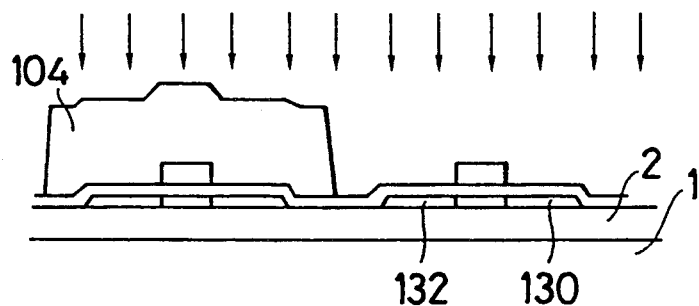

FIG. 6C shows a process in which boron is ion-implanted with a dose amount around $5 \times 10^{14}$ to $3 \times 10^{15}$ atoms/cm$^2$ on the whole surface in such state as shown in FIG. 6B. Source and drain areas 120 and 122 of P channel TFT are thus created. Next, in order to create source and drain areas 130 and 132 of N channel TFT, a mask such as a resist film 104 is formed covering the PTFT area and phosphorous is ion-implanted to an area to be NMOS with two to ten times of the dose amount of boron implanted in fabricating the PTFT, as shown in FIG. 6D.

Then the impurities implanted as described above are activated in temperatures more than 500° C. and hydrogen treatment is implemented to improve the characteristics of the thin film transistor. Both hydrogen treatment methods, i.e. a hydrogen plasma annealing treatment in which hydrogen atoms are created by plasma in a vacuum tank and a thin film transistor is exposed in it and a method for diffusing hydrogen by heat in 200° C. to 500° C., were proved to be effective.

Figure 6E:
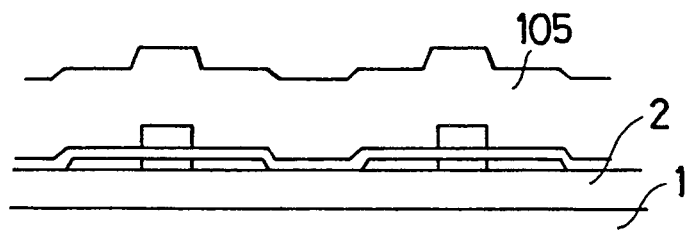

FIG. 6E shows a process in which silicon oxide is formed into a film as an interlayer insulating film 105 with a thickness of 5000 Å to 1.5 micrometer. Silicon oxide, PSG film and BPSG film are suitable for the interlayer insulating film 105 and they are formed using, for example, normal pressure CVD, low pressure CVD and sputtering. It may be structured also by forming a silicon oxide film with a thickness of 500 to 2000 Å by sputtering or optical CVD and by laminating many insulating films using liquid silica.

FIGS. 6F through 6J show processes for fabricating the photoelectric conversion layer in the same manner as in the first embodiment. The photoelectric converting area is formed on the interlayer insulating film 105.

Figure 6F:
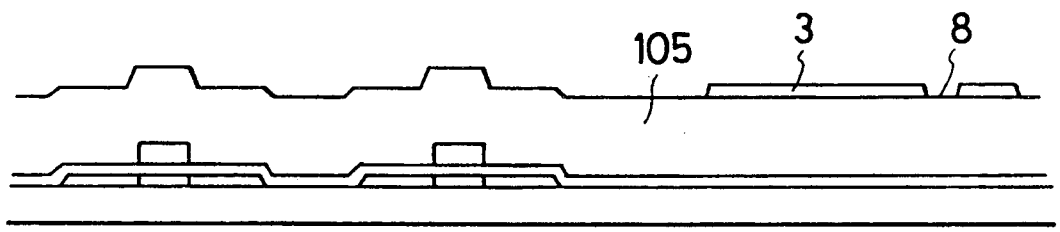

A metal, for example chrome, whose etching speed is fully late to an etchant used for silicon or silicon oxide is formed into a film with a thickness of 1000 to 2000 Å on the silicon oxide film by sputtering and is patterned into a first electrode 3 which also serves as a light blocking layer by photolithographic process as shown in FIG. 6F. A light introducing window (opening) 8 is provided per each one bit sensor in the first electrode whose other part functions as the light blocking layer.

Then a semiconductor layer 4 is formed. The semiconductor layer 4 comprises an N-type silicon carbide semiconductor layer in which phosphorus is doped, an intrinsic silicon semiconductor layer in which no impurity is doped and a P-type silicon carbide semiconductor layer in which boron is doped formed into a film by publicly known plasma CVD. The thickness of the film may be determined so that electrical characteristics required such as, for example, capacity between the first and second electrodes and characteristics of a diode of a photodiode are optimized; the P-type and N-type layers are preferred to be 100 to 600 Å, respectively, and the intrinsic layer is preferred to be 3000 Å to 1.2 micrometer.

Figure 6G:
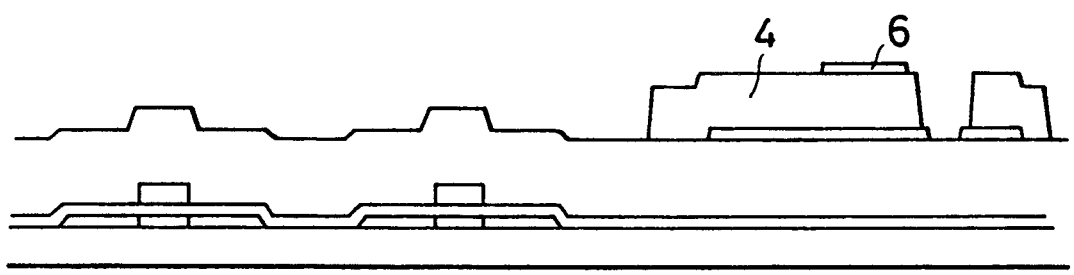
Figure 6H:
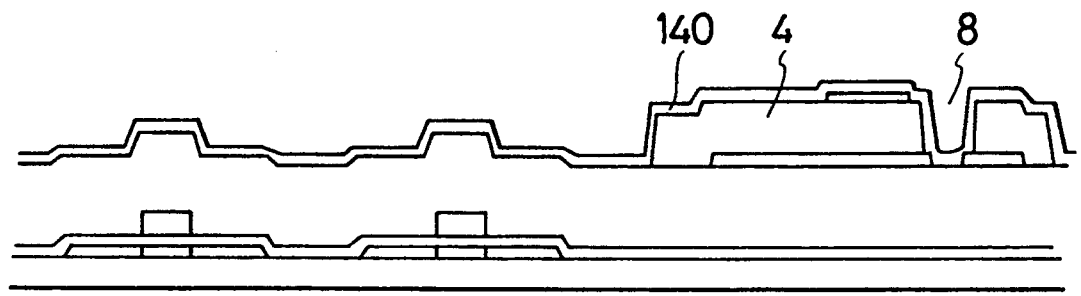

Then an ITO 6, a transparent conducting film, is formed thereon with a thickness of 700 to 2000 Å and is patterned into a predetermined dimension pattern of the photoelectric converting element and the semiconductor layer formed previously is dry-etched to obtain the state shown in FIG. 6G. At this time, an opening 8 is formed in the semiconductor layer as shown in FIG. 6G.

Then as an insulating thin film, a silicon nitrate film 140 is formed by optical CVD into a film with a thickness of 750 Å across the whole area of the photoelectric converting area and the TFT area over the ITO 6 and the TFTs. The silicon nitride film has the same function as the insulating film in the first embodiment and in the same time, effects as a protection film of the TFT area. That is, it has a function to block such impurities as that affects electrical characteristics of TFT like metals and alkali metals for example from infiltrating into the TFT area and serves for improving the reliability of the image sensor. In the same time, it is also provided above the ITO 6 to function as a protection film of the ITO. Although the silicon nitride film is used as the protection film in this embodiment, the contact hole may not be formed finely due to a large difference in etching rates of it and of the interlayer insulating film, the base of it, at this time. Due to that, temperature for forming the interlayer insulating film is slightly raised or speed for forming the silicon nitride film is increased to adjust the etching rates and to form the contact hole finely.

Figure 6I:
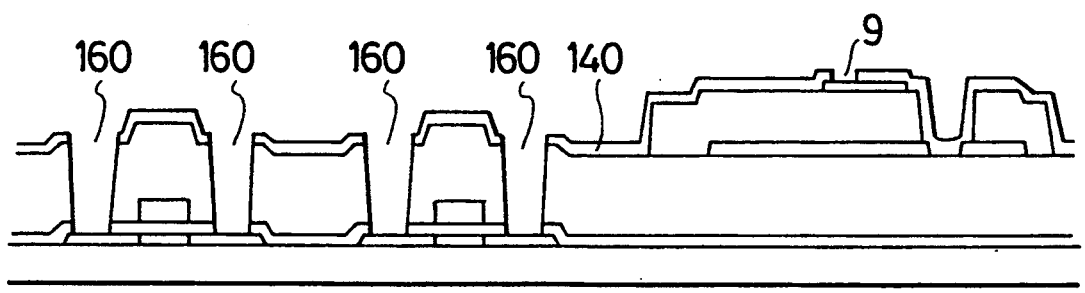

FIG. 6I shows a process for forming the contact holes (openings) for contacting the thin film transistor and the thin film second electrode wiring. At this time, since a mask is designed so that the contact holes for contacting the ITO 6 and the thin film second electrode wiring and the contact holes for contacting the thin film second electrode wiring and the thin film first electrode are formed in the same time, the number of the photomasks is not increased due to the formation of the insulating film of the present invention. That is, the insulating film 140 formed as described above is etched by photolithography to create therein on the ITO 6 the contact hole (opening) 9 for contacting the ITO 6 and the metal electrode 7. In the same time, the contact holes (openings) 160 are provided similarly in the insulating film 140 on each impurity area of the TFT to form source and drain area electrodes of the TFT.

Next, in order to better an electrical connection with the impurity areas, a surface to be coated with a metal layer in the later step is subjected to acid treatment in 1/100 HF to remove natural oxide formed on the surface. According to the present invention, no concave portion is created at the end portion of the semiconductor film 4 even after the acid treatment, since the insulating film 140 is provided.

Figure 6J:
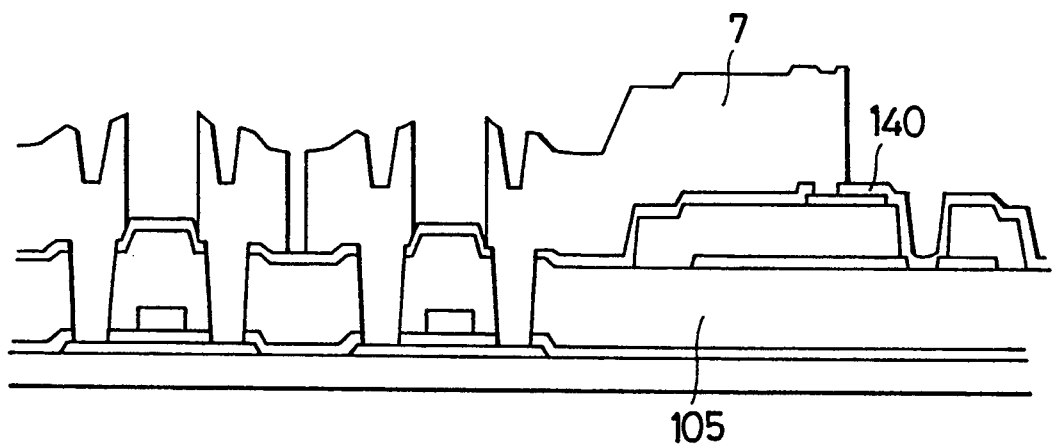

Then, as shown in FIG. 6J, the metal layer is formed on the insulating film over the openings by Al for example by sputtering and is patterned into the electrodes 7 by photolithography. Thereby, electrical connection is made between the thin film transistor and the photoelectric conversion element through the opening. The thin film forming process of the sensor part of the contact type image sensor of the present embodiment is now completed.

Figure 6K:
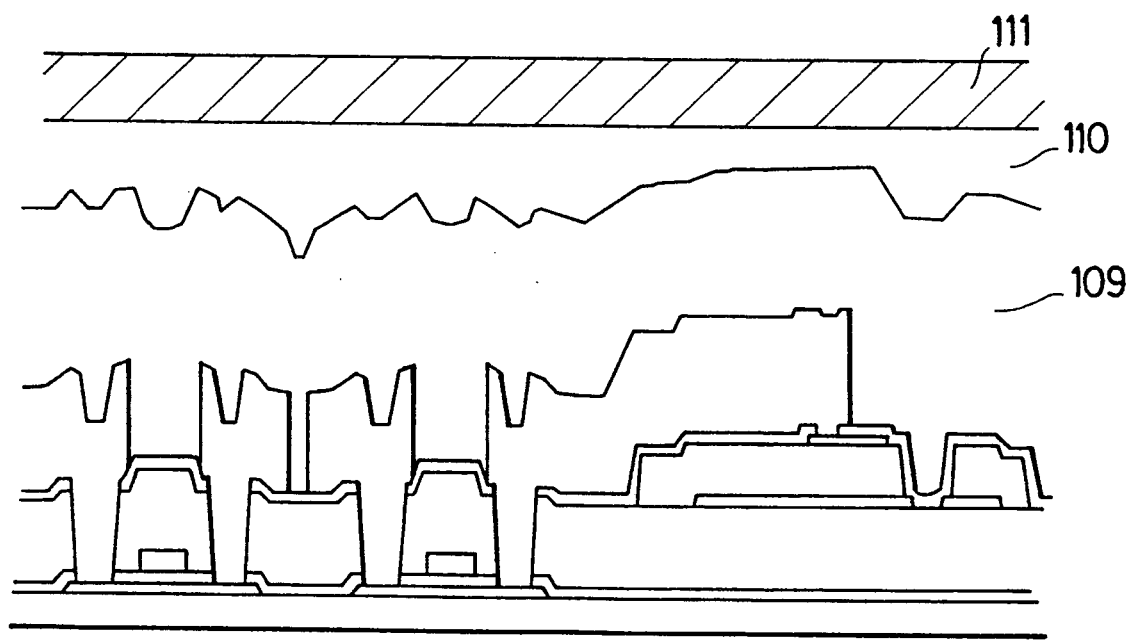

The image sensor is completed by pasting a thin plate glass 111 with 50 to 100 micrometer of thickness by an adhesive 110. As shown in FIG. 6K, a protection film 109 may be formed by polyimide and others before pasting the thin plate glass 111.

Because the image sensor thus fabricated has higher production yields and a driving circuit by the TFT is already structured on the substrate, the full contact type image sensor may be fabricated in very low cost.

According to the present invention, the insulating film is formed between the semiconductor film and at least one of the thin film first electrode and the thin film second electrode, except of a part of it, so that a leak current or short between the thin film electrodes due to pinholes created in the semiconductor film may be reduced considerably to a degree almost no such failure is caused.

Furthermore, the photoelectric converting element is connected to the circuit structured by the thin film transistors fabricated on the same substrate, so that the low cost image sensor having less outside circuits may be fabricated with higher yields.

Still furthermore, the end portion of the pattern of the semiconductor thin film is coated by the aforementioned insulating film, so that no electrode material is left at the step of the pattern and leak current between the sensor bits is significantly reduced from in order of $10^{-6}$ ampere to that of $10^{-11}$ ampere. The leak current between the first and second electrodes around the end portion of the thin film semiconductor is also reduced.

Furthermore, the transparent conducting film is coated by the aforementioned insulating film, so that the reduction, coloring and corrosion of the transparent conducting film are not caused by the resist releasing fluid and the fluid for etching electrode materials in principle. Therefore, a process margin of the image sensor is increased and its production yields are improved.

In addition to that, the insulating film formed on the TFT area functions as a layer for blocking impurities from infiltrating into the TFT area, so that the reliability of the image sensor is improved.

As many apparently widely different embodiments of this invention may be made without departing from the spirit and scope thereof, it is to be understood that the invention is not limited to the specific embodiments thereof except as defined in the appended claims.

What is claimed is:

1. A photoelectric conversion device comprising:
   an insulator;
   a first electrode comprising a metal and provided on said insulator;
   a photoelectric conversion semiconductor layer provided on said first electrode, said semiconductor layer having an upper surface and a lower surface;
   a second electrode formed on said semiconductor layer, said second electrode comprising (a) a transparent conductive layer in direct contact with a first portion of the upper surface of said semiconductor layer for constituting a photoelectric conversion region, and (b) a conductive lead extending over a second portion of the upper surface of said semiconductor layer and electrically connected to said transparent conductive layer; and
   an insulating film provided at least between said second portion of the upper surface of said photoelectric conversion semiconductor layer and said conductive lead where said conductive lead is connected to said transparent conductive layer at a contact portion and where the contact portion is substantially smaller in size than said second upper portion of the upper surface of the semiconductor layer and where said insulating film is in direct contact with the second portion of the upper surface of the semiconductor layer.

2. The device of claim 1 wherein said insulating film extends over said transparent conductive layer and said conductive lead is connected with said transparent conductive layer through an opening provided on said transparent conductive layer in said insulating film.

3. The device of claim 1 wherein said conductive lead extends beyond an edge of said semiconductor layer and said insulating layer prevents said conductive lead from directly contacting the edge of said semiconductor layer.

4. The device of claim 1 wherein said photoelectric conversion layer comprises a p-type semiconductor layer, an intrinsic semiconductor layer on said p-type semiconductor layer, and an n-type semiconductor layer on said intrinsic semiconductor layer.

5. The device of claim 1 wherein said insulating film comprises a material selected from the group consisting of $SiO_2$, $Si_3N_4$ and SiON.

6. The device of claim 1 wherein said first electrode does not transmit a light.

7. An image sensor having a plurality of sensor elements arranged in one direction comprising:
   a common electrode formed on a substrate;
   a photoelectric conversion semiconductor layer formed over said common electrode, said semiconductor layer having an upper surface and a lower surface;
   a plurality of individual electrodes arranged in one direction on said semiconductor layer and separated from one another, each of said individual electrodes comprising (a) a transparent conductive layer in direct contact with a first portion of the upper surface of said semiconductor layer for defining a photoelectric conversion region in said semiconductor layer and (b) a conductive lead electrically connected to said transparent conductive layer and extending (i) over a second portion of the upper surface of said semiconductor layer and (ii) beyond an edge of said semiconductor layer,
   wherein said conductive lead is prevented from directly contacting said semiconductor layer by an insulating film interposed between said second portion of the upper surface of said semiconductor layer and said conductive lead where said conductive lead is connected to said transparent conductive layer at a contact portion and where the contact portion is substantially smaller in size than said second portion of the upper surface of the semiconductor layer and where said insulating film is in direct contact with the second portion of the upper surface of the semiconductor layer.

8. The image sensor of claim 7 wherein said insulating film further extends on said transparent conductive layer and said conductive lead is connected with said transparent conductive layer through an opening provided on said transparent conductive layer in said insulating film.

9. The image sensor of claim 7 wherein said photoelectric conversion semiconductor layer is a continuous layer extending in said one direction.

10. The image sensor of claim 7 wherein said insulating film completely covers the edge of said photoelectric conversion layer on which said conductive leads are formed.

11. The image sensor of claim 7 wherein said photoelectric conversion layer comprises a p-type semiconductor layer, an intrinsic semiconductor layer on said p-type semiconductor layer, and an n-type semiconductor layer on said intrinsic semiconductor layer.

12. The image sensor of claim 7 wherein said insulating film comprises a material selected from the group consisting of $SiO_2$, $Si_3N_4$ and SiON.

13. The image sensor of claim 7 wherein said first electrode does not transmit a light.

* * * * *